(12) United States Patent
Wenner et al.

(10) Patent No.: US 6,225,141 B1
(45) Date of Patent: May 1, 2001

(54) TEMPERATURE SENSOR MANUFACTURING PROCESS

(75) Inventors: Ronald J Wenner, McAllen, TX (US); Henkerikus C Van Eldick, Leeuwarden (NL); Frank J Stier, South Milwaukee, WI (US); George Rudich, Cedarburg, WI (US); Bruce R Schultz, West Allis, WI (US); Fernando F Garcia, Reynosa (MX)

(73) Assignee: Johnson Controls Technology Co., Plymouth, MI (US)

( * ) Notice: Subject to any disclaimer, the term of this patent is extended or adjusted under 35 U.S.C. 154(b) by 0 days.

(21) Appl. No.: 09/390,263

(22) Filed: Sep. 3, 1999

(51) Int. Cl.[7] ................................................. H01L 21/00
(52) U.S. Cl. .............................. 438/54; 438/66; 438/14; 361/748
(58) Field of Search ............................... 438/16–17, 24, 438/54, 66, 14; 361/748–804; 428/901

(56) References Cited

U.S. PATENT DOCUMENTS 5,844,238 * 12/1998 Sauer et al. .......................... 250/232
6,118,426 * 9/2000 Albert et al. ......................... 345/107

* cited by examiner

*Primary Examiner*—Jey Tsai
(74) *Attorney, Agent, or Firm*—Quarles &Brady; George E. Haas

(57) ABSTRACT

The present method defines a plurality of individual temperature sensor cells on a single printed circuit board with a separate temperature detector mounted in each cell. The temperature response of each detector is characterized substantially simultaneously and the values for series and parallel trimmer resistors for each cell are determined from the temperature response of the detector for the cell. Then an automated machine attaches properly valued resistors in parallel and in series with each detector on the printed circuit board.

10 Claims, 2 Drawing Sheets

TEMPERATURE SENSOR MANUFACTURING PROCESS

BACKGROUND OF THE INVENTION

This invention relates to methods for manufacturing electrical temperature sensors, and more particularly to techniques for calibrating such sensors.

Electrical sensors are used to measure temperature in circuits which control a wide variety of equipment, such as building heating, ventilation and air conditioning (HVAC) systems and refrigeration cases. A common type of sensor utilizes a positive temperature coefficient (PTC) silicon detector which has a resistance that varies in relation to the ambient temperature. Thus, the sensors can be connected to a control circuit to provide an input signal which indicates ambient temperature.

Each type of detector has an ideal temperature to resistance response characteristic. However, a particular detector of that type has an actual response characteristic that typically differs from the ideal response. Thus, detectors of the same type will produce slightly different electrical signals when exposed to the same temperature. Furthermore, it often is desirable to optimize the response characteristic for a range of temperatures, for example a range which enables the device to be used in either a refrigeration case or a building room. The detector response characteristics also may have to be adjusted to be compatible with the control circuits.

As a consequence, in order to accurately measure temperature, it is necessary to calibrate the detector, that is change the actual response of the detector to match the ideal desired response as closely a practical. Calibration typically is accomplished by connecting trimmer resistors to the detector to form the complete temperature sensor. Specifically, one trimmer resistor is placed in series with the detector to offset the actual temperature response to the level of the ideal desired response. Another trimmer resistor is placed in parallel with the temperature detector to change the gain of the sensor (i.e. adjust the slope of the temperature response characteristic) to match the ideal desired response.

Previous calibration techniques required a significant amount of manual labor. Specifically, individual detectors were placed into a precision oven and heated to two different temperatures near the extremes of the desired temperature range for the completed sensor. The electrical signal produced by the sensor at each temperature was measured. These measurements then were fed into a computer which calculated values for the two trimmer resistors. Assembly workers then selected the appropriate valued resistors which were hand soldered to the detector in order to produce a finished calibrated temperature sensor. This process not only was labor intensive, but time consuming.

SUMMARY OF THE INVENTION

The present invention is directed to a process for mass producing calibrated temperature sensors which lends itself to the utilization of automated production equipment. The method involves defining a plurality of cells on a printed circuit board. Each cell contains electrically conductive first and second contact pads and first and second detector pads, with the first detector pad electrically connected to the first contact pad. A separate temperature detector is attached to the first and second detector pads in each cell.

Then a temperature response characteristic of the separate temperature detector in each cell is measured, thereby producing a measured temperature response characteristic associated with each cell. In the preferred embodiment the temperature response characteristic measurement includes exposing the printed circuit board to a first predefined temperature and then reading a first electrical signal from the temperature detector in each cell. Next, the printed circuit board is exposed to a second predefined temperature, and a second electrical signal is read from the temperature detector in each cell.

The measured temperature response characteristic associated with the given cell then is employed to derive a series resistance and a parallel resistance for the given cell, where the series resistance and the parallel resistance compensate for a difference between the measured temperature response characteristic and a desired response characteristic. First and second resistors having values corresponding to the series and parallel resistances are electrically connected to the temperature detector in the given cell. The derivation of the resistances and connection of resistor is performed for each cell of the printed circuit board.

Finally the printed circuit board is severed into the individual cells thereby producing a plurality of calibrated temperature sensors.

DETAILED DESCRIPTION OF THE INVENTION

Figure 1:
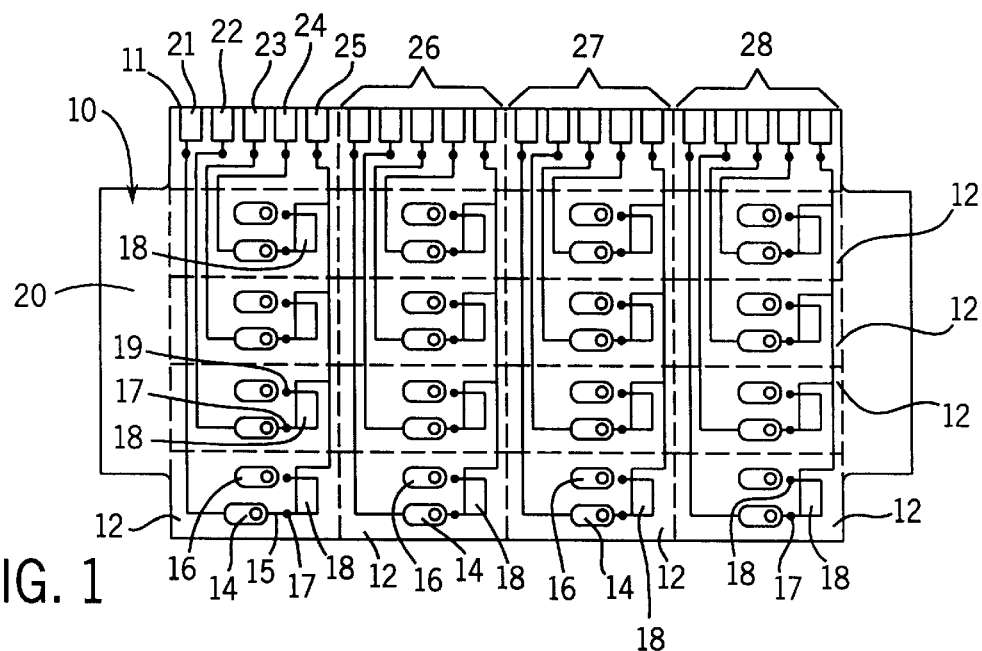
FIG. 1 illustrates one side of a printed circuit board array of temperature sensors at one stage manufacture.

With initial reference to FIG. 1, the present method is used to mass produce a plurality of temperature sensors which are initially contained on a common printed circuit board 10. Printed circuit board 10 is prepared by etching a conductive layer to form device mounting pads, terminals, and conductors utilizing standard photolithographic techniques. This produces a printed circuit board 10 that is subdivided into a two-dimensional array of cells 12 with the cell boundaries denoted by dashed lines. In the exemplary printed circuit board 10, the sensor cells are arranged in a four by four element array for ease of illustration. Usually a greater number of cells would be provided, for example, a five by sixteen cell array. Producing an array of individual sensors on a single printed circuit board lends itself to mass production utilizing automated manufacturing techniques.

The first surface 20 of the etched printed circuit board 10 has a first contact pad 14 and a second contact pad 16 which form the terminals for making external connection to the finished sensor. The cells 12 also have a first and second mounting pads 17 and 19 to which a temperature detector will be soldered. A printed circuit conductor 15 connects the first contact pad 14 to the first mounting pad 17 in each cell.

Along one edge 11 of the first surface 20 are twenty electrical edge terminals with those for the first column of sensors being numbered 21–25. A printed circuit conductor extends from edge terminal 21 to the first contact pad 14 for the lowermost cell 12 in the first column. Going upward in that column, the first contact pad 14 for the next sensor cell is connected by a printed circuit conductor to the second edge terminal 22, the first contact pad 14 in the third cell is coupled to edge terminal pad 23, and another printed circuit conductor connects edge terminal pad 24 to the first contact pad 14 in the uppermost sensor cell. The fifth edge terminal pad 25 is coupled by a printed circuit conductor to the second mounting pad 19 of every cell in the leftmost column. The other groups 26, 27 and 28 of five edge terminal pads for the other columns of sensor cells are similarly connected to the respective pads in each cell.

Figure 2:
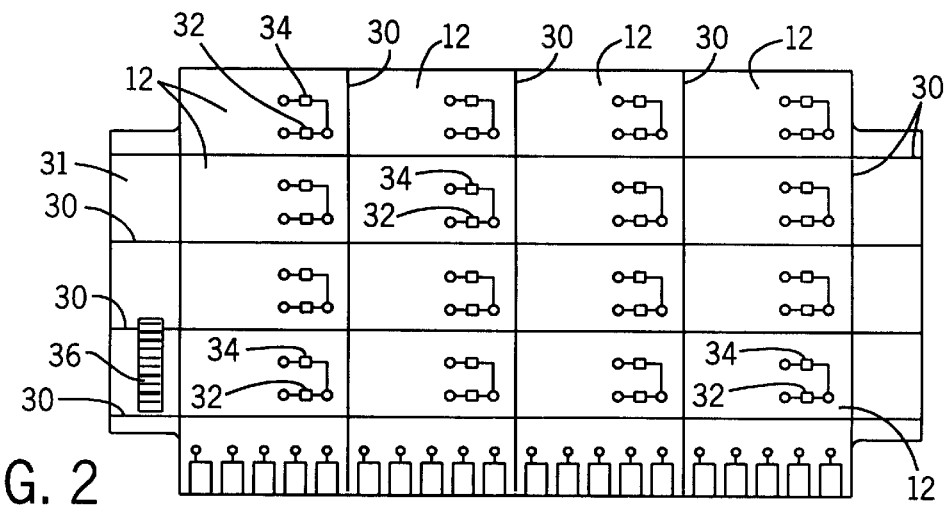
FIG. 2 shows an opposite side of the printed circuit board in FIG. 1.

With additional reference to FIG. 2, the two contact pads 14 and 16 and the second mounting pad 19 in each cell are connected by separate plated-through holes to the opposite second surface 31 of the printed circuit board 10. The plated-through holes are connected to mounting pads on the second surface 31 to which a pair of resistors will be soldered subsequently, as will be described. One of these resistors will be electrically in series with the detector between the two contact pads 14 and 16, and the other resistor will be electrically in parallel with the detector. The second surface 31 is scored along lines 30 to facilitate later separation of the cells to produce individual temperature sensors. A label containing a unique bar code 36 is applied to each printed circuit board for identification during subsequent manufacturing steps.

In the next step of the sensor assembly process, the printed circuit board 10 is placed into an automated assembly machine. That machine solders a PTC temperature detector 18 to the mounting pads 17 and 19 in each cell on the first surface 20 utilizing conventional surface mounting techniques.

Thereafter the values for the series and parallel resistors for attachment to the second surface 31 have to be determined to calibrate each PTC temperature detector 18. To do so the printed circuit board 10 is sequentially placed into a pair of test chambers which provide environments at two different temperatures (e.g. 5° C. and 85° C.) for measuring the performance of the detectors 18.

Figure 4:
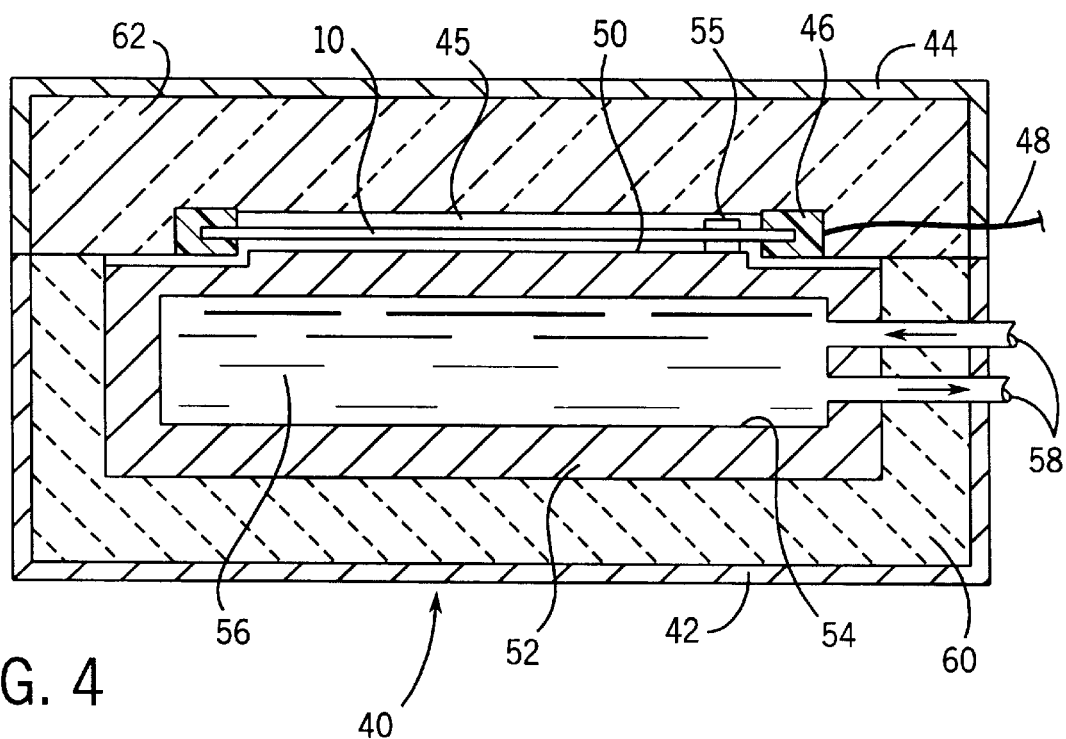
FIG. 4 is a cross-section through a chamber which creates test environment at a predefined temperature for calibrating the temperature sensors.

Referring to FIG. 4, each test chamber 40 comprises a cabinet 42 with a cover 44. The edge of the printed circuit board 18, along which the electrical terminal pads 21–28 are located, is inserted into a zero insertion force electrical connector 46 couples the pads via a cable 48 to a computer (not shown), such as a computer. When the cover 44 is closed onto the cabinet 42, the printed circuit board is adjacent a surface 50 of a thermal plate 52 that is formed of aluminum, for example. The thermal plate 52 has a cavity 54 through which a fluid 56 circulates from a larger temperature controlled bath connected to the cavity by pipes 58. The temperature of the fluid is very closely controlled to thermal plate 52 to the desired test temperature. Four temperature sensors 55, one adjacent each column of cells on the printed circuit board 10, are mounted to the thermal plate 52. Only one of the thermal plate sensors 55 is visible in FIG. 4. The printed circuit board 10 and the thermal plate are surrounded by thermal insulation 60 and 62.

Although the test chamber 40 is designed to produce as uniform a temperature within the region 45 occupied by the printed circuit board 10, some temperature variation exits within that region. Therefore, prior to use of a particular chamber 40, characterization of the temperature gradients within the test region 45 must be performed. This is accomplished utilizing a characterization printed circuit board which contains previously characterized reference temperature sensors located in each cell. The reference temperature sensors of the characterization printed circuit board are connected to edge terminals which mate with the electrical connector 46 of the test chamber 40. Thus the signals from the characterization temperature sensors can be read individually by the computer connected to cable 48. Specifically, the electrical signal between terminals 21 and 25, in FIG. 1, is produced by the temperature detector 18 in the lower left corner of the printed circuit board. The signal between terminal pads 22 and 25 is produced by the temperature sensor in the next position on the printed circuit board going upward in the leftmost column. In this manner, temperature readings at each of the sensor locations within the test region 45 are read by the computer.

During characterization of the test chamber 40, temperature readings are taken from each sensor on the printed circuit board and stored within the memory of the computer, along with temperature readings from the four plate sensors 55. The temperature readings then are employed to develop a polynomial equation which defines the relationship of the temperature at each circuit board cell in each column to the temperature reading from the plate sensor 55 for that column. The temperature Tsx at a given cell is given by:

$$T_{SX}=A*X^2+B*X+K+T_P \qquad (1)$$

where x is the location of the cell in the column, $T_P$ is the temperature reading from the column plate sensor, and A, B and K are constants. From this equation and the temperature reading of a column plate sensor the actual temperature at each cell location within the test region 45 can be determined. The characterization process can be repeated periodically to ensure that accurate temperature offsets are being used.

Once the temperature chamber has been qualified for operation, a printed circuit board 10 is placed into the chamber making electrical contact with the zero insertion force connector 46. The cover 44 is then closed bringing the printed circuit board 10 in close proximity to surface 50 of the thermal plate 52. The chamber then is brought to its operating temperature (e.g. 5° C. or 85° C.) and allowed to stabilize at that temperature. At that point, the computer reads the electrical signal produced by each PTC temperature detector 18 mounted on the circuit board 10 and calculates the corresponding temperature readings for each detector using the temperatures measured by the four plate sensors 55. These resistance readings and calculated temperatures are stored in an array in the memory of the computer along with the unique identifying number for the circuit board read from the bar code label 36 when the board was inserted into the test chamber 40.

The printed circuit board 10 then is removed from the first temperature test chamber 40 and allowed to reach room temperature. Thereafter, the printed circuit is placed in the second test chamber and stabilized at the other test temperature. Then another set of resistance readings are taken from the PTC temperature sensing devices 18 on the printed circuit board 10 and stored in the computer along with the corresponding temperatures that are calculated with thermal gradient adjustment based on signals from the four plate temperature sensors 55.

Figure 5:
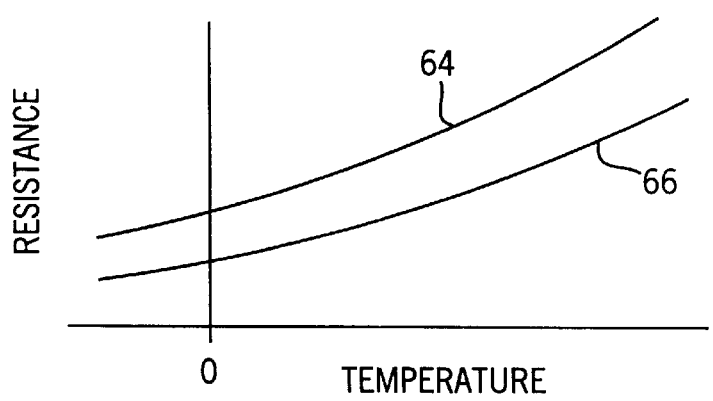
FIG. 5 is a graph depicting ideal and actual thermal responses for a particular type of temperature detector.

With reference to FIG. 5, the response of the ideal calibrated temperature sensor is indicated by curve 64 which relates the resistance of the sensor to temperature. By calibrating the detector, its signal will be optimal over the range of temperatures desired to be measured. An uncalibrated detector 18 has a temperature response curve, such as exemplary curve 66, which is below the ideal curve on the graph. The uncalibrated temperature response characteristic for one type of PTC detector is given by the equation:

$$R_D = R_O * [1 + \alpha*(T-T_{REF}) + \beta*(T-T_{REF})2 - E*(T-T_{UL})^D]$$

where $R_D$ is the resistance of the sensor, $R_O$ equals 1000 ohms, $\alpha$ has the constant value $7.874 \times 10^{-3}$, $\beta$ has the constant value $1.874 \times 10^{-5}$, $T_{REF}$ is 25° C., E is $3.42 \times 10^{-8}$ when $T > T_{UL}$ otherwise E is zero, D is 3.7 and $T_{UL}$ is 100° C. T is the temperature of the test chamber 40 in degrees Celsius and is produced for each sensor location by entering the temperature reading $T_P$ from the plate sensor 55 for the associated column of cells into the polynomial expression of equation (1).

An ideal PTC temperature detector 18 is calibrated to produce an ideal sensor response by using a series connected first resistor with a resistance $R_S$ equal to 50.629 ohms and a parallel connected second resistor having a resistance $R_P$ of 62984.676 ohms. Thus the temperature characteristic $R_T$ of an ideal sensor becomes:

$$R_T = \left( \frac{R_D * 62984.676}{R_D + 62984.676} \right) + 50.629$$

From this expression and their measurements from the two temperature test chambers for the actual detectors 18 being calibrated, the values of the first and second resistors can be calculated. The resistance $R_P$ for the parallel connected second resistor is derived from the expression:

$$R_P = \frac{a+b}{2*(R_{T2} - R_{T1} - \Delta R)}$$

where $R_{T1}$ is the resistance measured at 5° C., $R_{T2}$ is the resistance measured at 85° C., a is equal to $(R_{T1}+R_{T2})*\Delta R$, $\Delta R$ is the differential resistance between 5° C. and 85° C. for the ideal sensor, and $$b = \sqrt{a^2 + 4*(R_{T2} - R_{T1} - \Delta R)*(R_{T2}*R_{T1}*\Delta R)}$$

It should be understood that standard resistors are commonly available for only certain resistance values and thus one may not be available with the exact calculated resistance. $R_P$. Therefore a standard commercial resistor having a-value $R_{P-STD}$ that is closest to the calculated value is selected.

Then the resistance $R_S$ for the series connected first resistor is calculated using the formula:

$$R_S = 889.33 - \left( \frac{R_{T1} * R_{P-STD}}{R_{T1} + R_{P-STD}} \right)$$

Here too there may not be a standard commercial resistor available with the exact calculated resistance $R_S$ and a standard resistor with a value closest to the calculated resistance is selected.

This process is repeated for all the detectors 18 on the printed circuit board 10 and the selected values for the first and second resistors for each cell 12 are stored on a computer disk in a file for that particular circuit board, as identified by the bar coded number.

The printed circuit board 10 and computer disk then are placed into another automatic component placement machine which robotically picks resistors having the selected values from storage bins and solders the resistors to the pads of the appropriate cells on the printed circuit board. Specifically for each cell 12, a first resistor 32, having a value substantially equal to the series resistance $R_S$, is connected between the plated-through hole from the second contact pad 16 and a plated-through hole of the second mounting pad 19. Thus first resistor 32 is connected in series with the temperature detector 18 between the two contact pads 14 and 16. A second resistor 34 in each cell, having a value substantially equal to the parallel resistance $R_P$, is connected between the plated-through hole for the second mounting pad 19 and the plated-through hole for the first contact pad 14, thereby being connected in parallel with the temperature detector 18.

Figure 3:
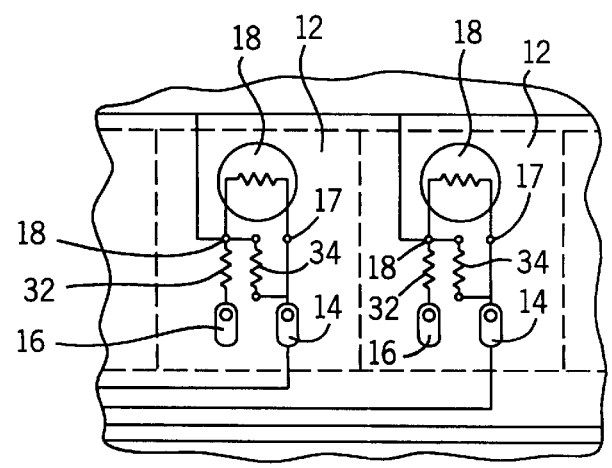
FIG. 3 is an electrical schematic diagram of two cells of the array of temperature sensors.

This interconnection of the components on the two surfaces 20 and 31 of the printed circuit board 10 form an individual sensor circuit in each cell as shown schematically in FIG. 3. The completed printed circuit board 10 then is broken along the score lines 30 to separate the individual sensor circuits.

What is claimed is:

1. A method for manufacturing temperature sensors comprising steps of:

(a) defining a plurality of cells on a printed circuit board wherein each cell contains electrically conductive first and second contact pads and electrically conductive first and second detector pads, wherein the first detector pad is electrically connected to the first contact pad;

(b) connecting a separate temperature detector to the first and second detector pads of each cell;

(c) measuring a temperature response characteristic of the separate temperature detector in each cell, thereby producing a measured temperature response characteristic associated with each cell;

(d) determining a series resistance and a parallel resistance for a given cell in response to the measured temperature response characteristic associated with the given cell, where the series resistance and the parallel resistance compensate for a difference between the measured temperature response characteristic and a desired response characteristic;

(e) in the given cell, connecting a first resistor between the separate temperature detector and the second contact pad, wherein the first resistor has the series resistance associated with that given cell;

(f) in the given cell, connecting a second resistor in parallel with the separate temperature detector, wherein the first resistor has the series resistance associated with that given cell; and (g) repeating steps (d), (e), and (f) for each one of the plurality of cells.

2. The method as recited in claim 1 further comprising severing the printed circuit board into individual cells.

3. The method as recited in claim 1 wherein measuring a temperature response characteristic comprises:

exposing the printed circuit board to a first predefined temperature;

reading a first electrical signal from the separate temperature detector in each cell, wherein the first electrical signal indicates a temperature being sensed;

exposing the printed circuit board to a second predefined temperature; and then reading a second electrical signal from the separate temperature detector in each cell, wherein the second electrical signal indicates another temperature being sensed.

4. The method as recited in claim 1 further comprising forming a plurality of terminals on a printed circuit board, wherein the first contact pad in each cell is electrically connected to a different one of the plurality of terminals, and at least one of the plurality of terminals is electrically connected to the second detector pad in more than one of the plurality of cells.

5. A method for manufacturing temperature sensors comprising steps of:
   (a) defining a plurality of cells on a printed circuit board wherein each cell contains electrically conductive first and second contact pads and electrically conductive first and second detector pads, wherein the first detector pad is electrically connected to the first contact pad;
   (b) connecting a separate temperature detector to the first and second detector pads of each cell;
   (c) exposing the printed circuit board to a first predefined temperature;
   (d) reading a first electrical signal from the separate temperature detector in each of the cells, wherein the first electrical signal is a function of a temperature sensed by a respective separate temperature detector;
   (e) exposing the printed circuit board to a second predefined temperature;
   (f) reading a second electrical signal from the separate temperature detector in each of the cells, wherein the second electrical signal is a function of another temperature sensed by a respective separate temperature detector;
   (g) determining a series resistance and a parallel resistance for a given cell in response to the first and second electrical signals associated with the given cell, where the series resistance and the parallel resistance compensate for a difference between an actual temperature response characteristic for the separate temperature detector in the given cell and a desired response characteristic;
   (h) in the given cell, connecting a first resistor between the separate temperature detector and the second contact pad, wherein the first resistor has the series resistance associated with that given cell;
   (i) in the given cell, connecting a second resistor in parallel with the separate temperature detector, wherein the first resistor has the series resistance associated with that given cell; and
   (j) repeating steps (g), (h), and (I) for each one of the plurality of cells.

6. The method as recited in claim 5 further comprising severing the printed circuit board into individual cells.

7. The method as recited in claim 5 further comprising forming a plurality of terminals on a printed circuit board, wherein the first contact pad in each cell is electrically connected to a different one of the plurality of terminals, and at least one of the plurality of terminals is electrically connected to the second detector pad in more than one of the plurality of cells.

8. The method as recited in claim 5 wherein exposing the printed circuit board to a first predefined temperature comprises placing the printed circuit board into a test chamber in which the printed circuit board is exposed to the first predefined temperature.

9. The method as recited in claim 8 further comprising characterizing temperature gradients within the test chamber, thereby enabling the actual temperature at each cell of the printed circuit board to be determined.

10. The method as recited in claim 5 wherein the series resistance and the parallel resistance for all of the plurality of cells are determined before the steps of connecting the first resistor and connecting the second resistor.

* * * * *